United States Patent [19]

Muzyczko et al.

[11] 4,224,398

[45] Sep. 23, 1980

[54] PHOTOPOLYMERIZABLE LATEX SYSTEMS

[75] Inventors: Thaddeus M. Muzyczko; Daniel C. Thomas, both of Melrose Park, Ill.

[73] Assignee: Richardson Graphics Company, Orland Park, Ill.

[21] Appl. No.: 43,478

[22] Filed: May 29, 1979

Related U.S. Application Data

[62] Division of Ser. No. 873,383, Jan. 30, 1978.

[51] Int. Cl.$^2$ .......................... G03C 1/58; G03C 1/68; C08F 2/50; G03F 7/08
[52] U.S. Cl. ................................. 430/175; 204/159.14; 204/159.15; 204/159.16; 430/176; 430/197; 430/287; 430/286; 430/907; 430/909; 430/910; 430/911; 427/54.1
[58] Field of Search ............... 430/175, 176, 197, 287, 430/286; 96/49, 86 P, 115 R; 204/159.14, 159.15, 159.16

[56] References Cited

U.S. PATENT DOCUMENTS

| | | | |
|---|---|---|---|
| 3,826,784 | 7/1974 | Satomura | 204/159.14 |
| 3,898,143 | 8/1975 | Assarsson et al. | 204/159.14 |
| 3,905,815 | 9/1975 | Bonham | 96/115 R |
| 3,926,642 | 12/1975 | Breslow et al. | 204/159.14 |
| 4,019,904 | 4/1977 | Noshiro et al. | 96/115 R |
| 4,046,843 | 9/1977 | Sano et al. | 204/159.14 |

*Primary Examiner*—Walter C. Danison
*Attorney, Agent, or Firm*—Lockwood, Dewey, Alex & Cummings

[57] ABSTRACT

A photopolymerizable system is provided as a latex system that is an oil-in-water polymer emulsion including particulates of water-insoluble polymers in combination with a water-soluble or water-dispersible, light-sensitive polymer having multiple light-sensitive moieties. Prior to coating onto a substrate, the system is a three-phase precursor emulsion of the emulsion particulates, the water phase, and the light-sensitive polymer. After coating, the bulk of the water phase is evaporated off, leaving a two-phase system of the emulsion particulates surrounded by the light-sensitive polymer. When selected areas are subjected to actinic radiation, a water-insoluble matrix is formed, the matrix containing cross-linked light-sensitive polymer having dispersed therethrough and/or included therein the water-soluble polymer particulates, thus forming oleophilic image areas. Those portions of the system that were not subjected to actinic radiation are then readily washed from the coated item to form the hydrophilic, non-image areas.

15 Claims, No Drawings

PHOTOPOLYMERIZABLE LATEX SYSTEMS

This is a division, of application Ser. No. 873,383, filed Jan. 30, 1978.

BACKGROUND OF THE INVENTION

The present invention relates to photopolymerizable systems including photopolymerizable compositions that are light-sensitive latices; photopolymerizable compositions on suitable backing members; and methods for their production and use. More particularly, this invention is directed to improved image producing compositions of the latex type which combine water-in-oil polymer emulsions of water-insoluble particulates with water-soluble or water-dispersible light-sensitive polymers that exhibit multi-functionality, which compositions can be placed on a suitable backing member using an aqueous carrier and thereafter subjected to actinic radiation at selected image areas to thereby insolubilize and cross-link the light-sensitive polymer to form a matrix, with the unradiated composition in the non-image areas being washed away to provide the desired planographic image.

It has been recognized that photopolymerizable systems having good durability when cured are composed of water-insoluble polymers. Heretofore, when using water-insoluble polymers in producing light-sensitive coatings for use on substrates such as planographic printing plates, these polymers are incorporated as part of a solvent system layer characterized by including organic materials for dissolving the polymer, which organic materials must be driven off of the plate onto which a light-sensitive coating layer is placed, this requirement being time and energy consuming, wasteful of the solvents, and hazardous to the operator and the environment. Thus, there is need to provide photopolymerizable systems which do not require an organic solvent medium, preferably systems that are water-based latex systems.

Systems have been proposed in which water-soluble or water-dispersible polymers are used along with a water-soluble light-sensitive compound. Such systems avoid the disadvantages of the organic-based systems, but they are not particularly long-lasting because the polymers are water-soluble and thus subject to erosion of the image area when in use and/or through the action of atmospheric moisture. In such systems, since they are water-based, it was previously believed that the polymer must be water-soluble or at least water-dispersible in order to achieve the necessary degree of internal compatibility within the system. In one such proposal, inherently water-insoluble polyvinyl acetate polymer is used in combination with water-soluble polyvinyl alcohol polymer so as to render the polyvinyl acetate polymer water-dispersible and thus compatible with the water-based system. Even after curing this type of system, the water-dispersible polymers are susceptible of inadvertent removal by ambient moisture.

Accordingly, it would be advantageous to provide photopolymerizable systems which are water-based but are not easily water-degraded because of the water-dispersible nature of the image-forming polymer. The present invention achieves these two goals simultaneously by combining a water-based latex and a water-dispersible sensitizer to prepare light-sensitive coatings that are substantially insolubilized by actinic radiation. More particularly, this invention provides a system in which the image-forming polymer is itself part of a precursor emulsion combining the water-insoluble polymer with a water-soluble or water-dispersible, light-sensitive polymer that becomes water-insoluble upon exposure to actinic radiation in order to form a matrix of the light-sensitive polymer surrounding and-/or with the water-insoluble polymer to thereby entrap or encapsulate the water-insoluble polymer to form a particularly strong image area quite suitable for use as a durable ink-receptive portion of a printing plate without further treatment. Additionally, since the portions of the system that are not struck with actinic radiation remain as a latex, water-based physical mixture system, these portions are easily washed from those portions of the surface on which no image-forming, ink-receptive material is desired. Such washing, of course, does not result in the evolution of any organic solvents. The system also sets up a matrix which is comprised of water-insoluble polymer particulates within a compacted matrix structure of the cured and water-insolubilized light-sensitive polymer, after exposure to actinic radiation.

It is, therefore, a general object of the present invention to provide an improved photopolymerizable system.

Another object of the present invention is to provide an improved composition and method for photopolymerizing an image upon a suitable substrate without using and evolving organic solvents.

Another object of this invention is to provide an improved composition and method useful in preparing planographic plates with the ease of use and clean-up that accompanies water-based systems.

Another object of the present invention is to provide an improved composition and method in which high molecular weight images can be produced at low coating viscosities, resulting in fewer light-induced cross-links being needed in order to form water-insoluble images.

Another object of the present invention is a photopolymerizable composition and method in which it is possible to use ionic interpolymer bonding as desired.

Another object of the present invention is to provide an improved photopolymerizable composition which is susceptible of being applied as an especially thick coating, as desired, in order to provide increased relief.

Another object of the present invention is an improved lithographic printing plate having a water-based photopolymerizable coating thereon, and a method for its production.

Further objects and advantages of this invention will be more clearly apparent from the following description. While the invention is particularly suitable for use in preparing lithographic plates, it is also useful in preparing various other types of plates, and has various coating applications as specified elsewhere herein and as will be apparent to those skilled in the art.

Basically, the present invention is a light-sensitive coating that is an emulsion mixture of a polymer emulsion component having water insoluble polymer particulates within an aqueous suspension medium, together with a water-soluble or water-dispersible light-sensitive component including a polymer having at least two moieties per molecule that are sensitive to actinic radiation for generation of a free radical or other cross-linking species to form a matrix of cross-linked polymer having encapsulated or entrapped therein and dispersed therethrough the water-insoluble polymer. Prior to curing, the system is characterized as a three-phase precursor emulsion including the water-insoluble polymer particulates within the aqueous suspension medium with which is also mixed the light-sensitive polymer. When the coated composition is applied, the aqueous suspension is substantially removed to realize a two-phase mixture of the polymer particulates and the light-sensitive polymer. When this coating is subjected to actinic radiation, the light-sensitive polymer cures or cross-links to thereby insolubilize same and at the same time form a matrix in which the water-insoluble polymer particulates are entrapped and of which they can be a part. This provides a coating which is easily applied as a low-viscosity, water-based material but which, after cure, is especially resistent to deterioration upon exposure to water-containing materials.

In the system of this invention, the water-insoluble polymer emulsion component and the light-sensitive component are present in quantities of the same order of magnitude. For example, they may be present in the emulsion mixture at a weight percent ratio on the order of 10:1 to 1:10, preferably 3:1 to 1:3.

The inventive coating, after said removal of substantially all of the water from the three-phase system, is described typically in terms of water-insoluble polymer matrix particles whose surfaces are coated with the water-soluble, light-sensitive polymer which becomes water-insoluble and cross-linked to form a rigid matrix structure upon exposure to radiation, thus rendering the total system water-insoluble. At the same time, the unexposed water-soluble, light-sensitive polymer coating said water-insoluble polymer matrix particles remains uncured and water-soluble and thus readily removable from the coated surface by washing with water. Generally, the water of the present emulsion system and that used for washing off the uncured emulsion may be of any pH as desired, although ordinarily it is satisfactory to use essentially neutral water.

The water-soluble, light-sensitive polymer present in the system prior to curing includes a multiplicity of functional groups per molecule which can react upon exposure to actinic radiation and thereby cross-link with itself and/or with other reactive polymers present, which may include the water-insoluble polymer emulsion particle itself that may or may not be also light-sensitive. The cured, cross-linked system is a substantially water-insoluble matrix of cross-linked polymers entrapping the water-insoluble polymer, which matrix is not susceptible to softening or partial insolubilizing when it comes in contact with an aqueous medium. This is a primary advantage of the present invention which combines this feature with its generally advantageous water-dispersible properties prior to curing.

The water-insoluble polymer emulsion particulate itself may be solid or liquid, but is preferably a solid that is hydrophobic and water-insoluble, although water-emulsifiable. Usually, the particulate will range in size from between 100 angstroms to 10 microns in diameter. The outer surface of this generally spherical particle may contain surfactant molecules, either added or formed in situ. A wide variety of molecular weights, from several hundred to several million, may be employed depending on the intended application and the desired properties. The emulsion particle size distribution may be mono- or poly-disperse.

Examples of acceptable emulsion particulates include acrylic co-polymers, styrene co-polymers, acetate co-polymers, vinyl chloride co-polymers, olefin co-polymers, etc. These particulates must have a glass transition temperature near room temperature, or else they will powder when used. The particulate is basically unreactive, although in some instances it can contain an unreactive core member which has bonded thereto a reactive substance which may under certain conditions react with the water-soluble, light-sensitive polymers when such material is cured by actinic radiation.

The water-insoluble polymer emulsions, or base resins, must be in the form of a water-based (oil-in-water) emulsion that is substantially free of organic solvents. They are preferably prepared by emulsion polymerization or they may, alternatively, be prepared as thermoplastic or thermoset polymers that have been emulsified with suitable surfactants. Such methods of preparation are well-known. Preparative Methods of Polymer Chemistry, Inter-Science Publishers, New York, 1968, Second Edition, by W. R. Sorenson and T. R. Campbell provides emulsion polymer preparation details. The solids content of the base polymer emulsion may be adjusted with water to yield the desired coating concentration, and several different emulsions varying in composition as well as particle size may be blended to obtain desired properties.

When proceeding with the preparation of the polymer emulsion component by conventional emulsion polymerization, there may be used, for example, any of the vinyl reactive monomers or combination of monomers which possess glass transition temperatures sufficiently low to form suitable films at desired working temperatures of the system. Suitable as emulsion polymerization components are homo- and co-polymers of, for example, the following monomers including internally or externally plasticized styrene, ethylacrylate, butylacrylate, ethyl methacrylate, butyl methacrylate, vinyl acetate, vinyl chloride, vinylidene chloride, butadiene, α-methyl styrene, hydroxy ethylacrylate, di-acetone acrylamide, lauryl methacrylate, stearyl methacrylate, lauryl acrylate, 2-ethylhexalacrylate, vinyl carbitol, vinyl toluene, styrene sulfonic acid, hydroxy propylacrylate, dimethyl aminoethylacrylate, dimethylamino-acrylate, acrylic acid, methacrylic acid, diethylamino ethyl-acrylate, dimethylamino propylmethacrylate, isoprene, chloroprene, maleic anhydride, maleimides, vinyl aziridines, vinyltetrazoles, vinyloxazolines, vinylpyrazoles, acryloyl cinnamolyloxyethyl acrylate, pyrrolidones, vinyltriazines, vinylphenothiazines, dimethylamino propylmethacrylamide, aryl acrylates, ethylene glycol acrylates such as polyethylene glycol acrylate, acrylamide methylol acrylamide, glycidyl methacrylate, chlorostyrene, bromostyrene, or other similar halogenated vinyl aromatics, tertiary butyl styrene, paramethyl styrene, and vinyl imidizole, methyl vinyl ether, phenylvinyl ether, vinyl pyrrolidone, 2 ethyl hexylacrylate, vinyl benzoic acid, amino styrene, vinyl propionate, vinyl amidizol, n-vinyl caprolactone, n-octyl acrylate and the like.

External plasticizers can be used to lower the glass transition temperature. There are usually added after the emulsion polymer has been made but before the coating operation. Conventional external plasticizers such as dioctylphthalate, tricresylphosphate, etc., may be used. Additionally external plasticizers having both plasticizing and photoreactive groups may be employed. These compounds or oligomers migrate into the emulsion particle and plasticize it thereby lowering the glass transition temperature. The presence of photoreactive groups enables the now plasticized and film cast emulsion particle to be sensitive to actinic radiation thereby more effectively insolubilizing the emulsion particles and even coreacting with the water dispersible light sensitive substances that surround the particles. Examples of such plasticizing-photoreactive additives are multifunctional acrylates, methacrylates, epoxy resins and the like. These must be of relatively low molecular weight, i.e., compounds and oligomers are generally preferred. Specific examples include trimethylolpropane triacrylate, trimethylolpropane trimethacrylate, acrylated or methacrylated epoxy or novolac resins, epoxidized novolacs, and pentaerythritol diacrylate. Certain reactive monomers have plasticizing properties but may not be as desirable because of their generally lower vapor pressure and hence odor. However, these may be employed as desired. Generally the speed of photochemical reactions with these mono or multifunctional plasticizers may be greatly increased with the use of sensitizers. Well known sensitizers such as benzoin, xanthone, benzophenone, etc., may be blended with the above mentioned plasticizers and then added to the emulsion. Further, the presence of these species after water has been removed and after suitable exposures and developments where appropriate have been made, open the possibility for heat or infrared treatments to postcure the surface coatings. Blocked isocyanates present yet another possibility.

As yet another approach suitable plasticizers may be used to dissolve high molecular weight photopolymers. This solution may then be added to the latices described above. The plasticizer acts as a carrier for the photopolymer and as the plasticizer migrates into the surface of the emulsion particle the high molecular weight light sensitive photopolymer only partially migrates into the particle surface so that the outer particle surface is now coated with an oleophilic photopolymer. Again sensitizers and other additives may be used as needed. Examples of such polymeric solutions include the following: phenoxy cinnamate polymers dissolved in dibutyl phthalate, with or without sensitizers; acrylated phenoxy resins; polyvinyl cinnamate; etc.

These water-insoluble emulsion polymerized components may be prepared by either conventional or seed polymerization techniques. In most cases, the emulsion polymerization process involves the use of surfactants to emulsify the monomers while the polymerization proceeds in the water emulsion itself. Surfactants stabilize the emulsion; otherwise, the formed particulates will coalesce to undesirably increase the viscosity of the emulsion. Certain polymerization reactants themselves form acceptable surfactants in situ to function as the required stabilizer for preventing coalescence, and in those instances no surfactant as such need be added during the emulsion polymerization process. The surfactants may be of the anionic or non-ionic or possibly even amphoteric or cationic type. More typically, the anionic and non-ionic types are used, such as sodium lauryl sulfate, potassium lauryl sulfate, or the hydroxylated tertiary octylphenols. It is also possible to use silicone emulsifiers, in which case the outer surface of the final emulsion particulate will have some of the silicone emulsifier present thereon.

In some instances when seed emulsion polymerization is used, to a large extent the outermost sphere of the emulsion particulate produced thereby may contain certain active groups which could co-react with the light-sensitive polymer, other cross-linking agents present in the system, or both, when exposed to actinic radiation so that the water-insoluble polymer particulate would itself be chemically attached to the matrix formed by the light-sensitive polymer or other such cross-linking materials.

The emulsion polymerization process is typically initiated with free radical initiators such as azo-bis-(isobutyronitrile), persulfate systems, lauryl peroxide, benzoylperoxide, and the like. Usually, the persulfate systems such as ammonium persulfate are used.

Alternatively, when emulsion polymerization is not possible or not desired, the polymer emulsion particulates can first be formed and then emulsified. This approach is particularly suitable when the polymer selected is not liquid but is capable of being dissolved in a suitable solvent and then emulsified. Usually these polymers are thermoplastic, homo-or co-polymers such as the silicones, poly(di-alkyl)siloxanes, condensation polymers, and various other types. For example, a silicone polymer may be emulsified with an anionic or non-ionic surfactant; or appropriate surfactants may be used with cinnamate polymers such as polyvinyl cinnamate, phenoxyl cinnamate, and various other light-sensitive or non-light-sensitive polymers. When using this alternative preparation process, after emulsification, the solvent may be removed by distillation, azeotropic distillation, or similar technique, leaving the emulsified powder within the liquid system. This alternative process is also useful to employ mixtures of polymers.

Examples of typical polymers which would be suitable for preparation by this alternative method are: polyvinyl acetate, polyvinyl chloride, copolymers of polyvinyl acetate and polyvinyl chloride, polyvinylidene chloride, phenoxy resins, phenoxy cinnamate resins, polyvinyl cinnamates, polycarbonate resins, polysulfones, polyepoxide resins, polyesters such as polyethylene terphthalate, nylons such as nylon 6, nylon 8, nylon 11, nylon 12 or any number of other polyamides which are not of the basic nylon structures and known in the art, polyesters prepared by the condensation process of diols and dicarboxylic acids such as the reaction of ethylene glycol with phthalic anhydride butylene glycol, crotonic acid, propylene glycol and other similar materials.

Examples of polyesters prepared as just indicated are well-known in the art, prepared with a variety of molecular weights and a variety of structures including branched and linear arrangements. Other materials include certain rubber latexes, polybutadienes, and polyurethanes. The latter are usually prepared by the condensation reaction of diisocyanate and a diol, a diisocyanate and a diamine, or a diisocyanate and any diactive hydrogen compound.

In producing the water-insoluble polymer particulate emulsion either through emulsion polymerization or through emulsifying a thermoplastic or thermosetting polymer, certain compounds can be added during such polymerization or emulsification in order to enhance the production of or the final properties of the particular emulsion. Typically, surfactants, antihalition agents, sensitizers such as aromatic ketones, dyes, pigments, fillers, extenders, cross-linked particles, or any other material which can be used to aid in maintaining or modifying the viscosity, the glass transition temperature, the plasticity and/or the stability of the water-insoluble polymer can be used. It should be understood that such materials may also be added after the actual emulsification process, but before coating.

The water-soluble or water-dispersible, light-sensitive polymer included in the system of the present invention is one that will be in aqueous solution within the water phase of the system and also will be rendered insoluble or substantially insoluble upon exposure to actinic radiation. This polymer should contain at least two reactive moieties per molecule of the polymer, which reactive moieties are of the type capable of generating free radicals or other active species upon exposure to radiation. The free radicals or other active species cause curing or cross-linking of the light-sensitive polymer with itself, with other light-sensitive polymers, or with a mixture of the same or other light-sensitive polymers and other polymers which can react upon being subjected to free radicals or other active species.

The light-sensitive polymers are in the form of dimers, trimers, tetramers, oligomers, etc., or they may alternatively be in the form of high molecular weight polymers having pendant reactive groups and in which the backbone contributes to producing a large-chain molecule. The molecular weights of such polymers can range up to one million (1,000,000) or even several million. They are organic and are generally classed as photosensitizers, photoinitiators, photopolymers, photoactive monomers, photoactive compounds, or combinations thereof. They may be, for example, chloral, bromal, water solubilized haloalkyl compounds such as ethylene chlorohydrin; dimethyl amino ethyl phenyl ketone or salt thereof; polyesters containing unsaturated groups and having a high acid number of salts thereof; alphaketo acids both aliphatic and aromatic and of compound or polymeric formation; xanthone carboxylic acid; water soluble acrylates such as hydroxy ethyl acrylate, hydroxy propyl acrylate; diacetone acrylamides; the salt of diacrylated dimethylol propionic acid; maleic anhydride copolymers reacted with hydroxy, thio or amino alkyl acrylates or with amino, thio or hydroxy allylic mono- or multi-functional compounds.

It is important to the present invention that the light-sensitive polymers of the system be soluble, solubilizable, or dispersible in the aqueous medium; otherwise, the photopolymerizable system of this invention will not be water-dissolvable prior to curing and will not be water developable.

Specific examples of acceptable multifunctional diazo light-sensitive polymers include diazo polymers prepared by the condensation reaction of a diazo diphenylamine and formaldehyde, which is generally in the form of an oligomer or a low molecular weight polymer.

Other diazo structures suitable for use in the present invention include tetrazo compounds that exhibit the requisite solubility or dispersibility. Basically, any polymer backbone that has appended therefrom two or more diazo structures can function in this regard so long as the system exhibits the needed adequate compatibility with aqueous systems.

When the system includes as the light-sensitive polymer component materials such as the multifunctional diazo compounds, those components upon being subjected to radiation cross-link to become water-insoluble while simultaneously forming a matrix and locking thereto the water-insoluble polymer particles component of the present system. Likewise, the matrix may be formed with and include one or more other light-sensitive materials which may be of a similar chemical structure or other significantly different structure; or the matrix may include chemical linkages between the light-sensitive materials and the water-insoluble polymer particles, although such a feature is not necessary since even a totally inert water-insoluble polymer may be quite adequately entrapped within the matrix in accordance with the present invention.

The light-sensitive polymer component may be a compound such as an azide, a sulfonyl azide, a copolymer or a material having a polymer structure and that contains one or more of the azide or sulfonyl azide functional structures. Such azide type materials are particularly suitable if they are synthethized or modified so as to enhance the degree of their water-solubility or water-dispersibility.

Another of the type of compounds suitable for use as the light-sensitive polymer are water-solubilized cinnamate systems, such as an ethoxylated novolac that is reacted with a·cinnamoyl chloride. Such a structure would exhibit adequate compatibility with the aqueous system of this invention. Still, in order to exhibit particularly advantageous light response, it might be desirable to add sensitizing species to such a system, for example, Michler's ketone, benzoin methyl ether, or the like.

Also suitable for use in the light-sensitive polymer component of the present system are the various water-soluble or water-dispersible acrylates that are not necessarily photoreactive or very slowly photoreactive, yet are cross-linkingly responsive upon contact with free radicals or other active species to themselves form similar reactive species to accomplish the desired matrix formation. In some instances, such materials can react with the surface of the water-insoluble polymers particles. Examples of this class of water-soluble component include: acrylates such as hydroxy ethylacrylate, hydroxy propylacrylate, polyethylene glycol acrylates, dimethylaminoacrylates, dimethylaminoethylacrylates, dimethylaminoethylmethacrylates, acrylamides, epoxylated hydroxy ethyl acrylamides, sulfonal ethyl acrylates, acrylic acid and methacrylic acid. In general, any acrylate, vinyl or olefinic reactive moiety which has water-soluble groups on it or on the same molecule which contains such a moiety will function.

Other materials that are themselves not necessarily photoreactive but which may be used together with a light-sensitive polymer for cross-linking or reaction therewith include olefin or vinyl groupings and materials such as polyethylene glycol diacrylate, pentarithritol acrylates, methylene bis-acrylamide, calcium diacrylate, and in general, any diacrylate salt which is water-soluble or can be made water-soluble by attachment thereto of a water-solubilizing species. It is important to point out, when selecting reactive species which themselves are not necessarily photoreactive but when mixed with a light-sensitive polymer can react therewith upon exposure to radiation, that the primary purpose of using such materials is to increase the molecular weight of the light-sensitive polymer to form an insolubilized matrix of a continuous phase rather than allowing such material to reduce its molecular weight through photodegradation during the curing steps.

In general, when it is desired to enhance the sensitivity to actinic radiation of the light-sensitive polymer component, known sensitizers can be added. Many of these sensitizers, while generally characterized as being water-insoluble, can be rendered water-soluble through suitable solubilizing procedures and added to the system for improving the system's reactivity to actinic radiation. Such materials include Michler's ketone, benzoin, benzoin methyl ether, or other well-known sensitizers. The sensitizers may be water-solubilized through using them in conjunction with materials such as amines, amine salts, quarternary amines, sulfonate, sulfate, sulfite, phosphate, phosphite, phosphonate, or poly-epoxy groups.

The method of using the systems of the present invention as light-curable coatings includes applying the three-phase emulsion system of water, water-insoluble polymer, and light-sensitive polymer to a selected substrate, removing the bulk of the water component of the three-phase emulsion to form the two-phase system, and thereafter exposing the two-phase system to actinic radiation, thereby curing and thus water-insolubilizing the light-sensitive polymer to form the oleophilic matrix. Formation of the three-phase system is accomplished by mixing together a light-sensitive polymer, preferably in aqueous solution, with an oil-in-water latex emulsion of water-insoluble polymer particulates, said emulsion being achieved through either emulsion polymerization or by emulsifying an existing thermoplastic or thermosetting polymer, both as discussed elsewhere herein. Where non-oleophilic, non-image areas are desired, such areas are shielded from the actinic radiation and are readily washed from the substrate for easy water developability.

More particularly, the systems according to the present invention may be applied to a substrate through any suitable coating technique, such as spray, roll, or dip methods. When the substrate is a printing plate, it may be made of aluminum, copper, zinc, magnesium, steel, or plastic. After coating, the water phase may be evaporated or dried to remove the carrier water at low or at elevated temperatures and with or without aid of a vacuum, leaving the water-insoluble emulsion particulates surrounded by the light-sensitive polymer and any other components present in the system, along with a small amount of residual water. After exposure to actinic radiation by any suitable light source such as carbon arcs, metal halogen lamps, pulsed xenon, lasers, or electron beams, usually through a negative or suitable stencil, the light-hardened areas are substantially ink-attractive or oleophilic, whereas the portions not exposed to actinic radiation remain water receptive or hydrophilic and are readily removed to form the non-image areas by simple water development, which may be assisted by agitation and/or brushing. Also, when used in making planographic plates, the plates may be developed on the press, wherein the water fountain solution acts as the developer. Other standard developing or gumming techniques may be used when desired. In general, the print quality is quite good with little tendency to "scum", i.e. the hydrophilic, non-image areas become oleophilic, or to "blind," i.e., the cured image areas become less oleophilic, suitable for reproduction of several thousand high-quality prints.

The system of the present invention, in addition to its usefulness in making planographic plates, especially with lithographic plates, may also be used in preparing silk screen resists, circuit board resists, photoengraving resists, light-sensitive inks, protective coatings for wood, metal or other surfaces, offset printing plates, shallow, deep relief and matrix letterpress plates, deep etch printing fabric coatings, gravure plate and cylinder resists, multi-metallic plate coatings, and offset inks and varnishes. The system is especially suitable for preparing lithographic plates having negative working properties.

EXAMPLE 1

A water developable lithographic subtractive plate was prepared. A photosensitive layer according to the present invention was dip-coated onto a brush grained aluminum metal plate having a silicate sub-base coating. The composition included as the water-soluble light-sensitive polymer component 2 parts by weight of an aqueous mixture including 5.0 weight percent of a diazo resin produced by the condensation reaction of para-diphenylamine diazonium chloride with formaldahyde (Diazo Resin No. 4 produced by Fairmont Chemicals); 1.0 weight percent citric acid; and 0.2 weight percent methylene green (Basic Green No. 5) in deionized water. With this light-sensitive mixture was mixed 1 part by weight of the water-insoluble polymer particulate emulsion component, which was an aqueous emulsion containing 5.0 weight percent in deionized water of a carboxyl modified butadiene-acrylonitrile co-polymer known by the tradename Hycar 1571 (B. F. Goodrich Company).

The dip-coated plate was then allowed to dry, a commercial sensitivity guide stencil was placed thereover, and the plate was exposed to a metal halogen light having a 5,000 watt input yielding in the 300 to 400 nanometer range, with an output power of approximately 500 microwatts per square centimeter. The exposure lasted for two minutes. After exposure, observation of the plate indicated that color change was good. The plate was thereafter rinsed with tap water and gummed with an asphaltum gum etch (Rage S produced by Richardson Graphics Company). Further observation of the plate indicated that the contrast was good, the image produced from the plate was good, and the background was clean. Step wedge exposure observed in conjunction with the sensitivity guide indicated a solid step wedge of up to 6, with a visible step wedge of up to 11.

The thus prepared plate was subjected to a press test which included a blinding test for 1,000 copies. After the blinding test, a roll-up test at 1,000 copies was performed, wherein the entire exposed plate was coated with ink and thereafter allowed to print until a clean image was observed. It took approximately 40 copies after roll up before a clean copy was printed. Run lengths well in excess of 2,000 according to the press test were observed.

Another plate prepared as described in this example was developed with an emulsion lacquer composition bearing the tradename Gard 160 Black, produced by Richardson Graphics Company and comprising resin, pigment and other organic materials emulsified in an aqueous solution. The exposed plate was developed by coating the plate with this material, all excess developer being wiped off of the plate prior to testing. A blinding test was performed as described previously for 1,000 copies, after which a roll-up test was performed wherein the entire exposed and developed plate was coated with ink and thereafter allowed to print again until clean copies were printed. It took approximately 40 copies before a clean production was made, and again the run length according to the press test was well in excess of 2,000 copies.

EXAMPLE 2

The same type of substrate used in Example 1 was dip-coated with a mixture of 1 part by weight of the light-sensitive, water-soluble polymer component of Example 1 with 1 part by weight of a 5.0 percent by weight solution of LE-455 emulsion (Union Carbide) which is a silicon including polymer based on a poly (dimethyl siloxane) polymer in deionized water. The coated plate was thereafter exposed under a sensitivity guide was accomplished in Example 1. The color change after exposure was observed to be acceptable. It was then developed using a tap water rinse and thereafter was coated with the asphaltum gum etch material used in Example 1. The contrast observed on the plate was acceptable, the image was good, and the background after exposure was clean. The step wedge observation indicated a solid wedge of 6 and a visible wedge of 13.

On a press using standard printing techniques, blinding took place for 500 copies. At 1,000 copies, roll-up was performed, clean copies being produced at about 40 copies. From the printed copies prepared during the press test, it was estimated that over a 2,000 copy run could easily be performed.

An identical plate was then exposed and developed with an emulsion lacquer in accordance with the last portion of Example 1. The blinding test showed blinding at 1,000 copies, with roll-up at 1,000 copies being clean at about 40 copies. The run length totaled greater than 2,000 copies, at which time the copies produced were still acceptable.

EXAMPLE 3

The base plate used in Example 1 was coated with various ratios of the two components of the present invention as shown in Table I. Solution A in that Table was a 5.0 weight percent concentration of Diazo Resin No. 4, 1.0 weight percent zinc chloride, and 0.1 weight percent methylene green in a deionized water solution. Solution B comprised a 5.0 weight percent concentration of the silicon emulsion polymer component used in Example 2.

TABLE I

| Emulsion No. | Solution A | Solution B |
|---|---|---|
| | Weight Parts | |
| 3A | 1 | 1 |
| 3B | 2 | 1 |
| 3C | 3 | 1 |
| 3D | 1 | 2 |
| 3E | 1 | 3 |
| Control | 100% | 0 |

The various parts-by-weight mixtures shown in Table I were placed on the type of plate used in the previous examples. Each emulsion mixture was hand-wiped onto the plate, and was then exposed under identical conditions as those of the previous examples under a step sensitivity guide. After exposure, the plates so produced were developed using either Chicago tap water (Table II) or the water and oil lacquer emulsion specified in Table III. After development, the plates were treated with asphaltum gum etch material and placed on a press. The developed plates were put in a quickset Van Son offset press; lithoblack ink 40904 was used on a Harris LUH 1050-sheet fed unit with conventional dampners; the speed was maintained at approximately 6,000 impressions per hour; the plate contact rolls consisted of two dampening rolls of cotton canvas and three rubber ink rolls; the blanket was a diamond blue 0.065 inch three-ply having a size of approximately 21×21½ inches; the blanket cylinder was undercut 0.075 inches and overpacked 0.005 inches; the fountain solution used was a mixture of Hydrogum and Hydroetch maintained at a pH of about 4.5 and comprised approximately 13 milliliters of Hydrogum and 22 milliliters of Hydroetch per gallon of Chicago tap water; the plate size was approximately 20½ by 16⅝ inches; the plates were overpacked 0.001 inches; the paper used in performing the printed test was a white Carlton Bond long-grained 20 pound packing paper, Riegel Presspac in 0.002, 0.003 and 0.005 sizes; and the plate cylinder was 0.015 inch undercut. Results of these press tests are tabulated in Tables II and III. Emulsion 3E of Table II was able to produce 25,000 acceptable copies; a run length in excess of 57,000 copies was observed when it was tested on an S-31 base plate (anodized).

TABLE II

| Emulsion No. | 3A | 3B | 3C | 3D | 3E | Control |
|---|---|---|---|---|---|---|
| Contrast | light | light | light | light | light | light |
| Image | OK[1] | OK[1] | OK[1] | OK[1] | OK[1] | good |
| Background | clean | clean | clean | clean | clean | clean |
| Press Test Results | | | | | | |
| Step Wedge: | | | | | | |
| solid | 11 | 8 | 5 | 9 | 9 | 6 |
| visible | 14 | 13 | 11 | 10 | 10 | 7 |
| Blinding | 200 | 300 | 400 | 300 | 10 | 1000 |
| Roll Up | OK | OK | OK | OK | OK | OK |
| Run Length | 1000 | 1000 | 1000 | 1000 | 1000 | 1000 |

NOTE:
[1] indicates spots were present.

Plates in this Table were made by hand-wiping the emulsions described in Table I above on the plate and were developed, using Chicago tap water followed by treatment with an asphaltum gum etch (RAGE S produced by Richardson Graphics Company).

TABLE III

| Emulsion No. | 3A | 3B | 3C | 3D | 3E | Control |
|---|---|---|---|---|---|---|
| Contrast | light | light | light | light | light | OK |
| Image | OK[1] | OK[1] | good | OK | OK | good |
| Background | clean | clean | clean | clean | clean | clean |
| Press Test Results | | | | | | |
| Step Wedge: | | | | | | |
| solid | 6 | 6 | 6 | 8 | 8 | 6 |
| visible | 11 | 11 | 11 | 12 | 12 | 7 |
| Blinding | 50 | 10 | 100 | 10 | 10 | 10 |
| Roll Up | OK | OK | OK | OK | OK | OK |
| Run Length | 1000 | 1000 | 1000 | 1000 | 1000 | 1000 |

NOTE:
[1] indicates spots were present.

Plates in this Table were produced by hand-wiping the emulsion described in Table I above on the plate base and were developed, using an emulsion lacquer (GARD 160 Black No. 161-34-008 produced by the Richardson Graphics Company) followed by treatment with an asphaltum gum etch (RAGE S also produced by Richardson Graphics Company).

EXAMPLE 4

The base plate used in the previous examples was coated with various latex emulsion mixture combinations of a Solution C photoreactive component and a Solution D water-insoluble particulate emulsion polymer component. Solution C included approximately 5.0 weight percent Diazo Resin No. 4, 1.0 weight percent citric acid, and 0.1 weight percent methylene green, in a deionized water solution. Solution D contained approximately 5.0 weight percent in deionized water of a carboxyl modified butadiene-acrylonitrile co-polymer latex emulsion, known by the tradename Hycar 1571 (B. F. Goodrich Company). Four emulsion mixtures of solutions C and D were produced and coated upon plates by wiping the emulsion on each plate and allowing it to dry. The plates thus produced were exposed for one minute in a manner described in Example 1. The color change after exposure appeared adequate and the appearance after coating was slightly mottled due to coating particles. Results of observational tests after development and press tests of the exposed and developed plate in accordance with Example 3 are tabulated in Tables IV and V. The emulsion mixture No. 4A included 1 part by weight of Solution C to 1 part by weight of Solution D; No. 4C was 3 parts by weight of Solution C to 1 part by weight of Solution D; and the control was all Solution C only.

TABLE IV

| Emulsion No. | 4A | 4B | 4C | Control |
| --- | --- | --- | --- | --- |
| Contrast | OK | OK | OK | OK |
| Image | fair | OK | spots | OK |
| Background | clean | clean | spots | clean |
| Press Test Result: | | | | |
| Step Wedge | | | | |
| solid | 5 | 6 | 8 | 7 |
| visible | 10 | 11 | 9 | 12 |
| Blinding | 1000+ | 1000 | 1000 | 1000+ |
| Roll Up | OK | OK | OK | OK |
| Run Length | 1000 | 1000 | 1000 | 1000 |

NOTE: Plates in this Table were developed, using Chicago tap water followed by treatment with asphaltum gum (RAGE S produced by Richardson Graphics Company).

TABLE V

| Emulsion No. | 4B | 4C | Control |
| --- | --- | --- | --- |
| Contrast | OK | OK | OK |
| Image | good | OK | OK |
| Background | clean | clean | clean |
| Press Test Results: | | | |
| Step Wedge | | | |
| solid | — | 8 | 2 |
| visible | — | 9 | 3 |
| Blinding | 500 | 50 | 10 |
| Roll Up | OK | OK | OK |
| Run Length | 1000 | 1000 | 1000 |

NOTE: Plates in this Table were developed, using an emulsion lacquer (GARD-160 Black produced by Richardson Graphics Company) followed by treatment with an asphaltum gum etch (RAGE S produced by Richardson Graphics Company).

EXAMPLE 5

A subtractive plate latex coating which has excellent visible image contrast after exposure was made, using the following photosensitive composition in accordance with this invention. One part by weight of a 4.0 weight percent solution of a polymer emulsion comprising a carboxylated poly(vinyl alcohol) known by the tradename Gelva C-5V16 (Shawinigan Resins Company) was dissolved in methyl cellosolve acetate, and was mixed with 1 part by weight of a 4.0 weight percent of Diazo HC-117 (American Hoechst Company) dissolved in ethanol, and 1 part of a 2.0 weight percent solution of HD506 Spirit Blue (American Hoechst Company) dissolved in xylene. This photosensitive composition was used to overcoat a diazo presensitized plate which was brushed grained aluminum plate having a silicate subbase thereon. The resulting plate coating was somewhat mottled because it was coated from three solvents. However, after exposure, the visible image contrast was excellent.

EXAMPLE 6

Approximately 0.3 weight percent of Diazo Resin No. 4 was blended with 3.0 percent by weight of an emulsion polymer known by the tradename Richatex-200, an acrylic emulsion polymer made with sodium lauryl sulfonate surfactant and containing about 30% solids, including a variety of acrylate monomer emulsion polymers to provide a latex system. Two plates were made with this solution, one a diazo presensitized, and the other a wipe-on or unsensitized plate. Both plates were dried at room temperature, and when they were exposed to a metal halogen light source through a negative a fast photo speed was noted, and both plates could be adequately developed with water.

EXAMPLE 7

The same coating solution described in Example 2 was prepared, with the exception that the Diazo Resin No. 4 was replaced with Diazo Resin L (Sherman Chemical Company), a monofunctional diazonium salt. This negative plate could not be adequately developed after exposure to a suitable radiation source, illustrating the fact that a multifunctional light-sensitive component is necessary in order to produce enough free radicals upon exposure to allow sufficient cross-linking to take place and form a matrix, thereby entrapping the insoluble polymers of the system according to this invention.

It will be apparent to those skilled in this art that the present invention can be embodied in various forms. Accordingly, this invention is to be construed and limited only by the scope of the appended claims.

We claim:

1. A lithographic plate having a light-sensitive composition coated thereon, comprising a base lithographic printing plate and a coating of a light-sensitive latex composition thereon, said composition including an emulsion mixture of a polymer emulsion component of water and water-insoluble polymer particulates together with a water-soluble or water dispersible light-sensitive polymer component capable of forming a water-insoluble matrix upon exposure to actinic radiation, said light-sensitive polymer containing at least two reactive moieties per molecule, each such moiety being capable of generating active chemical species upon exposure to actinic radiation to form the matrix, said matrix containing cross-linked light-sensitive polymer with said polymer particulates dispersed therethrough, said emulsion mixture being a three-phase precursor emulsion of said water-insoluble polymer particulates in an aqueous suspension medium containign said light-sensitive polymer, and said emulsion polymer component present at a weight percent ratio range from about 1:10 to 10:1 relative to said light-sensitive component.

2. The plate of claim 1, wherein said ratio range is from about 1:3 to 3:1.

3. The plate of claim 1, wherein said polymer emulsion is of the type that is prepared by emulsion polymerization.

4. The plate of claim 1, wherein said polymer emulsion is of the type that is prepared by emulsifying an existing polymer.

5. The plate of claim 1, wherin said water-insoluble polymer particulates include active groups which react with the light-sensitive polymer upon formation of the matrix.

6. The plate of claim 1, wherein said water-insoluble polymer particulates are hydrophobic, water-emulsifiable, generally spherical, of a diameter between about 100 angstroms to 10 microns, have a glass transition temperature near room temperature, and have molecular weights between about several hundred to several million.

7. The plate of claim 1, wherein said light-sensitive polymer is of a polymer class selected from the group consisting of dimers, trimers, tetramers, oligomers, and polymers up to a molecular weight of several million.

8. The plate of claim 1, wherein said light-sensitive polymer is selected from the group consisting of diazo polymers, azide polymers, cinnamate polymers, and acrylate polymers.

9. The plate of claim 1, wherein said polymer emulsion component includes a carboxyl modified butadiene-acrylonitrile copolymer and said light-sensitive polymer component includes a diazo resin condensation product of formaldehyde with paradiphenylamine diazonium chloride.

10. The plate of claim 1, wherein said polymer emulsion component includes a poly(dimethyl siloxane) polymer and said light-sensitive polymer component includes a diazo resin condensation product of formaldehyde with paradiphenylamine diazonium chloride.

11. The plate of claim 1, wherein said polymer emulsion component includes a carboxylated poly(vinyl alcohol) and said light-sensitive polymer component includes a diazo resin.

12. The plate of claim 1, wherein said polymer emulsion component includes an acrylic emulsion polymer and said light-sensitive polymer component includes a diazo resin.

13. The plate of claim 1 further comprising an external plasticizer having both plasticizing and photoreactive groups.

14. The plate of claim 13 wherein said external plasticizer is a multifunctional compound selected from the group consisting of acrylated or methacrylated epoxies, multifunctional acrylates, multifunctional methacrylates, and multifunctional epoxies.

15. The plate of claim 1 further comprising an external plasticizer containing a high molecular weight photosensitive polymer.

* * * * *

UNITED STATES PATENT AND TRADEMARK OFFICE
CERTIFICATE OF CORRECTION

PATENT NO. : 4,224,398
DATED : September 23, 1980
INVENTOR(S) : Thaddeus M. Muzyczko and Daniel C. Thomas It is certified that error appears in the above-identified patent and that said Letters Patent are hereby corrected as shown below:

In the Abstract, line 15, "water-soluble" should be --water insoluble--.

Column 1, line 8, after "invention" should be --generally--.

Column 1, line 24, "provide" should be --produce--.

Column 11, line 5, "was" should be --as--.

Column 14, line 51, "containign" should be --containing--.

Column 14, line 53, "present" should be preceded by --is--.

Signed and Sealed this

Twenty-fourth Day of February 1981

[SEAL]

Attest:

RENE D. TEGTMEYER

Attesting Officer

Acting Commissioner of Patents and Trademarks